United States Patent [19]
Hoffman

[11] Patent Number: 6,028,354
[45] Date of Patent: Feb. 22, 2000

[54] MICROELECTRONIC DEVICE PACKAGE HAVING A HEAT SINK STRUCTURE FOR INCREASING THE THERMAL CONDUCTIVITY OF THE PACKAGE

[75] Inventor: Paul Hoffman, Chandler, Ariz.

[73] Assignee: Amkor Technology, Inc., Chandler, Ariz.

[21] Appl. No.: 08/949,585

[22] Filed: Oct. 14, 1997

[51] Int. Cl.[7] .......................... H01L 23/12; H01L 23/14; H01L 23/48; H05K 1/16
[52] U.S. Cl. ........................ 257/706; 257/796; 257/712; 257/673; 257/713; 361/704; 361/714
[58] Field of Search .................................. 257/678, 706, 257/778, 707, 673, 712, 796, 713, 715, 717, 676, 690, 784, 786, 787; 361/766, 704, 714, 765, 718, 782; 174/521, 524

[56] References Cited

U.S. PATENT DOCUMENTS

| | | | |
|---|---|---|---|
| 5,148,265 | 9/1992 | Khandros et al. | 257/669 |
| 5,148,266 | 9/1992 | Khandros et al. | 257/669 |
| 5,346,861 | 9/1994 | Khandros et al. | 438/15 |
| 5,633,785 | 5/1997 | Parker et al. | 361/766 |
| 5,677,575 | 10/1997 | Maeta et al. | 257/778 |
| 5,684,330 | 11/1997 | Lee | 257/778 |
| 5,753,974 | 5/1998 | Masukawa | 257/737 |
| 5,757,078 | 5/1998 | Matsuda et al. | 257/778 |

FOREIGN PATENT DOCUMENTS

| | | | |
|---|---|---|---|
| 62-144346 | 6/1987 | Japan | H01L 23/34 |
| 8-083818 | 3/1996 | Japan | H01L 21/60 |
| 9-246416 | 9/1997 | Japan | H01L 23/12 |
| 10-022411 | 1/1998 | Japan | H01L 23/12 |

OTHER PUBLICATIONS

Bindra, A., "BGAs drop to micro size" *Electronic Engineering Times* (1994).

Costlow, T., "Packaging developers look to BGAs, MCMs" *Electronic Engineering Times* (1994).

DiStefano, T., "Reliable BGAs emerge in micro form" *Electronic Engineering Times* (1994).

DiStefano, T. and Wakabayashi, S., "μBGA SMT for the 90s?" *Surface Mount Technology® Magazine* (1995).

Loo, M. et al., "Surface Mount Studies of Fine Pitch Micro Ball Grid Array" *Proceedings of International Electronics Packaging Conference*(1994).

Mitchell, C., "Assembly and Reliability Study for the Micro–Ball Grid Array" *Proceedings of the 16th IEEE/CPMT International Electronics Manufacturing Technology (IEMT) Symposium*, Part 1 of 2 (1994).

Tessera™ System Building Blocks: "The Tessera® μBGA™ Package, A low cost alternative to high pin–count packaging" (2 pages).

Tessera™ System Building Blocks: (6 pages).

Wakabayashi, S. and DiStefano, T., "The μBGA as a Chip Size Package" *Proceedings of the 1995 NEPCON West Technical Program*(1995).

*Primary Examiner*—Alexander Oscar Williams
*Attorney, Agent, or Firm*—Skjerven, Morrill, MacPherson, Franklin & Friel LLP

[57] ABSTRACT

A thermally enhanced package for an integrated circuit, the integrated circuit having a surface with bond pads formed thereon, includes a heat sink structure attached to a central region of the integrated circuit surface inward of the bond pads. The package further includes a substrate attached to the heat sink structure. The heat sink structure includes a heat sink and first, second adhesive layers between the heat sink and the integrated circuit, substrate, respectively. The heat sink enhances heat transfer between the integrated circuit and the substrate. Further, the first, second adhesive layers decouple any difference in thermal expansion between the integrated circuit, the heat sink and the substrate.

36 Claims, 5 Drawing Sheets

MICROELECTRONIC DEVICE PACKAGE HAVING A HEAT SINK STRUCTURE FOR INCREASING THE THERMAL CONDUCTIVITY OF THE PACKAGE

FIELD OF THE INVENTION

The present invention relates to the art of electronic packaging and more particularly to a microelectronic package with enhanced thermal performance.

BACKGROUND OF THE INVENTION

Ball grid array (BGA) packages for integrated circuits are widely used in the semiconductor packaging industry. Since BGAs use area array contacts, instead of conventional perimeter leads, the physical size of high pin count packages can be significantly reduced. The relatively large pitch size in conventional BGAs requires large package bodies to accommodate high input/output terminal (I/O) applications. To further reduce the size of the packages and accommodate high I/O applications, near chip size BGAs (BGAs which are nearly the size of the integrated circuit that is packaged) have recently been developed.

Figure 1:
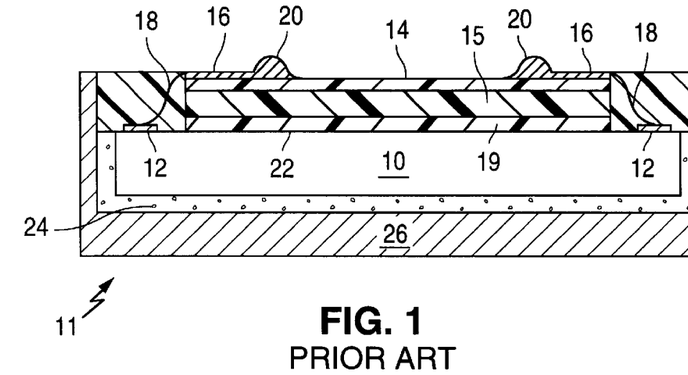
FIG. 1 is a cross-sectional view of a ball grid array in accordance with the prior art.

DiStefano, "Reliable BGAs emerge in micro form", *Electronic Engineering Times* Pg. 104, 111 (September 1994) discusses a near chip size BGA developed by Tessera® Inc. (Tessera® μBGA™). FIG. 1 is a cross-sectional view of a similar BGA 11. In FIG. 1, an integrated circuit 10 has a first surface 22 with a plurality of bonding pads 12 thereon. Bond pads 12 are connected to a plurality of metallizations or traces 16 on a substrate 14 by electrical connectors 18 such as bond wires. Bumps or balls 20 are formed on each trace 16 to enable electrical connections between BGA 11 and other electrical components. A compliant elastomeric layer 15 is located between integrated circuit 10 and substrate 14. Compliant elastomeric layer 15 is attached directly to the first surface 22 of integrated circuit 10 with silicone encapsulant material 19. Integrated circuit 10 is bonded using a layer of adhesive 24 to a thermal spreader 26. Connectors 18 are encapsulated to complete the fabrication of BGA 11.

Compliant elastomeric layer 15 compensates for or takes up the difference in the thermal coefficient of expansion (TCE) between integrated circuit 10 and substrate 14. Compliant elastomeric layer 15 is required because substrate 14, formed of flexible polyimide film, has a relatively high thermal expansion rate compared to the thermal expansion rate of integrated circuit 10. By accommodating for TCE mismatch, compliant elastomeric layer 15 provides protection against stress related problems such as warping and solder ball cracking. However, since compliant elastomeric layer 15 is an elastomer and elastomers are poor thermal conductors, heat transfer from integrated circuit 10 through first surface 22 is inhibited. Yet it is desirable to enhance heat transfer from integrated circuit 10. Further, elastomers have a tendency to absorb moisture from the ambient environment leading to delamination of compliant elastomeric layer 15 and ultimately to the failure of BGA 11.

It is desirable to form an integrated circuit package that is approximately the size of the integrated circuit. Further, as the art moves towards integrated circuits which consume more power, it becomes increasingly important that heat from the integrated circuit package is readily dissipated to the ambient environment. Further, the integrated circuit package should be resistant to environmental degradation.

SUMMARY OF THE INVENTION

In accordance with the invention, a thermally enhanced package for a semiconductor device, the semiconductor device having a first surface with bond pads formed thereon, includes a heat sink structure attached to a central region of the first surface of the semiconductor device inward of the bond pads. The package further includes an electrically insulative substrate having a first surface attached to the heat sink structure. The heat sink structure includes a heat sink, a first layer of adhesive between the heat sink and the first surface of the semiconductor device and a second layer of adhesive between the heat sink and the first surface of the substrate. By forming the heat sink structure with a heat sink, heat transfer between the first surface of the semiconductor device and the substrate is enhanced compared to the prior art.

Further, the first and second adhesive layers decouple any difference in thermal expansion/contraction (i.e. decouple any TCE mismatch) between the semiconductor device, the heat sink and the substrate. This increases the reliability of the package as well as any bonds formed between the package and another electronic structure such as a printed circuit board. Also, the first and second adhesive layers avoid the necessity of a compliant elastomeric layer of the prior art and the associated unreliability, e.g. moisture related problem such as delamination of the compliant elastomeric layer.

In accordance with another embodiment of the present invention, a thermally enhanced package for a semiconductor device includes a heat sink structure which is a mixture of a first component and a second component. The first component (e.g. adhesive) is for decoupling thermal stress (TCE mismatch) between the semiconductor device and the substrate and the second component (e.g. diamond, aluminum nitride or silver powder filler) is for enhancing heat transfer from the first surface of the semiconductor device to the substrate.

In accordance with the present invention, a method of fabricating thermally enhanced packages for semiconductor devices includes providing a strip-like tape comprising a plurality of electrically insulative substrates. Each of the substrates has a first surface with a heat sink structure and electrically conductive traces attached thereto. Central regions of first surfaces of the semiconductor devices are then attached to the heat sink structures and the traces are then electrically connected to the bond pads. A coverlay is applied to a first surface of the tape and thereby to second surfaces of the substrates. An encapsulant is applied to enclose the bond pads and sides of the heat sink structures and then the coverlay is removed. After interconnect balls are formed on portions of the traces and in apertures in the substrates, the tape is cut to singulate the packages.

These and other objects, features and advantages of the present invention will be more readily apparent from the detailed description of the preferred embodiments set forth below taken in conjunction with the accompanying drawings.

DESCRIPTION OF THE PREFERRED EMBODIMENTS

Several elements in the following figures are substantially similar. Therefore similar reference numbers are used to represent similar elements.

Figure 2:
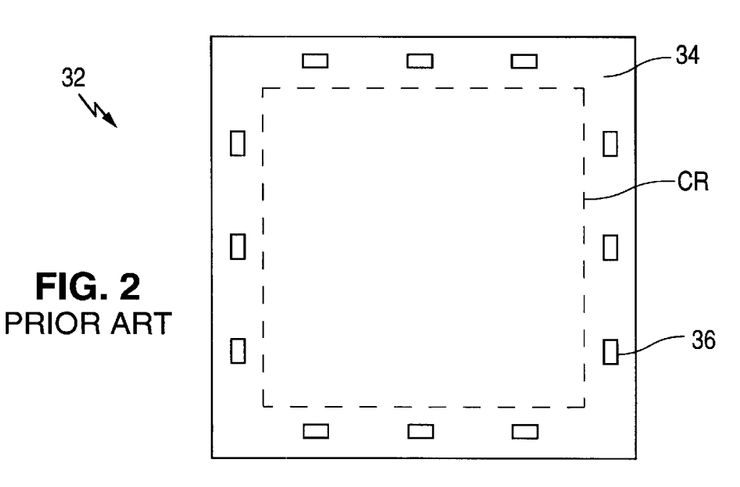
FIG. 2 is a top plan view of a conventional integrated circuit.

FIG. 2 is a top plan view of a conventional integrated circuit 32 (IC 32). IC 32 includes a first surface 34 with one or more bond pads 36 formed thereon. Bond pads 36 are adjacent to the perimeter of IC 32 and allow electrical interconnection with the internal circuitry (not shown) of IC 32. Bond pads 36 also define a central region CR of first surface 34 central to bond pads 36, i.e. surrounded by bond pads 36.

Figure 3:
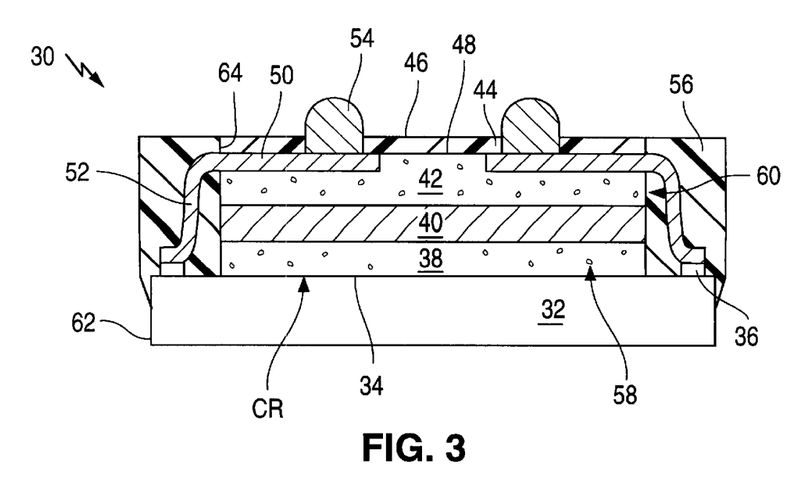
FIG. 3 is a cross-sectional view of a thermally enhanced integrated circuit package in accordance with the present invention.

FIG. 3 is a cross-sectional view of a thermally enhanced integrated circuit package 30 in accordance with the present invention. Integrated circuit package 30 includes a first adhesive layer 38 formed of a soft, low stress adhesive such as a silicone, modified epoxy, modified rubber adhesive or elastomer having a Shore D hardness no greater than approximately 35. First adhesive layer 38 overlies central region CR of first surface 34. Overlying first adhesive layer 38 is a heat sink 40 and overlying heat sink 40 is a second adhesive layer 42. Heat sink 40 is formed of a material having a high thermal conductivity, e.g. copper or another material having a heat transfer coefficient no less than approximately 50 W/M°K. Second adhesive layer 42 is formed of a low stress adhesive similar to or the same as the adhesive which forms first adhesive layer 38. First adhesive layer 38, heat sink 40 and second adhesive layer 42 together form a heat sink structure 58.

Overlying second adhesive layer 42 is a substrate 44 having a first surface 46 facing away from IC 32 and a second surface 48 facing IC 32. Substrate 44 is a flexible electrically insulating material, typically a conventional polyimide film or tape, but can be formed of other suitable flexible electrically insulating materials. Second substrate surface 48 has one or more metallizations or traces 50 formed thereon. Traces 50 are formed of an electrically conductive material, e.g. copper, copper alloy, or another metallic material. In one embodiment, heat sink 40 is formed of an electrically insulating material having a high thermal conductivity such as aluminum nitride thereby insuring that traces 50 are electrically isolated from heat sink 40 (i.e. to prevent traces 50 from shorting to heat sink 40). In other embodiments, an electrically insulative solder mask is applied on second surface 48 and traces 50 to insure that traces 50 are electrically isolated from heat sink 40.

Traces 50 have overhang portions 52 extending beyond substrate 44 which are bonded to corresponding bond pads 36. Extending through substrate 44 to corresponding traces 50 are bumps or interconnect balls 54. Each interconnect ball 54 is electrically connected to a corresponding bond pad 36 by a corresponding trace 50. Interconnect balls 54 can be arranged in an array thus forming a ball grid array (BGA). Alternatively, interconnect balls 54 can be arranged at the perimeter of substrate 44. Interconnect balls 54 allow electrical interconnection between integrated circuit package 30 and other electronic devices (not shown), e.g. a printed circuit board (PCB).

An electrically insulative encapsulant 56 encloses bond pads 36 including the adjacent portions of first surface 34 of IC 32, overhang portions 52 of traces 50 and sides 60 of heat sink structure 58. Encapsulant 56 also encloses sides 62 (or a portion thereof) of IC 32 and sides 64 of substrate 44 but leaves first surface 46 of substrate 44 exposed, i.e. uncovered by encapsulant 56. Encapsulant 56 protects bond pads 36 and overhang portions 52 of traces 50 and the bond formed therebetween from the ambient environment, e.g. moisture, and the associated corrosive effects. Further, encapsulant 56 protects and electrically isolates overhang portions 52 and bond pads 36 from contact, e.g. during handling of integrated circuit package 30.

Heat sink structure 58 enhances thermal performance of integrated circuit package 30 compared to the prior art. More particularly, by forming heat sink structure 58 with an interior heat sink 40, heat transfer between first surface 34 of IC 32 and substrate 44 is increased (the thermal resistance is reduced) compared to the prior art. Illustratively, the thermal resistance from first surface 34 of IC 32 to the ambient air environment is approximately 80° C./W in accordance with the present invention and approximately 140° C./W for the same structure without heat sink structure 58. Thus heat generated by IC 32 is more efficiently transferred to the ambient environment. Further, since heat sink 40 is formed of a thermally conductive material, heat is distributed substantially uniformly over heat sink 40 (i.e. the temperature distribution of heat sink 40 is substantially uniform) which further enhances heat transfer from IC 32 to the ambient environment.

Of importance, first adhesive layer 38 decouples any thermal coefficient of expansion (TCE) mismatch between IC 32 and heat sink 40, i.e. decouples any difference in thermal expansion/contraction between IC 32 and heat sink 40. Further, second adhesive layer 42 decouples any TCE mismatch between substrate 44 and heat sink 40. By decoupling TCE mismatch, first and second adhesive layers 38, 42 substantially eliminate thermal stress between IC 32, heat sink 40 and substrate 44. This increases the reliability of integrated circuit package 30 as well as any bonds formed between integrated circuit package 30 and another electronic structure, e.g. a printed circuit board which would be connected to interconnect balls 54.

Referring to FIG. 1, in the prior art, complaint elastomeric layer 15 is attached to first surface 22 of integrated circuit 10 by a silicone encapsulant material 19. However, as those skilled in the art understand, silicone encapsulant has a tendency to bleed and contaminate bond pads 12 and connectors 18 thereby reducing the yield (the number of acceptable BGAs 11 obtained on average from a given total number of BGAs 11 fabricated typically expressed as a percentage). Further, compliant elastomeric layer 15 absorbs moisture from the ambient environment further decreasing the yield and reliability of BGA 11.

In contrast, referring to FIG. 3, integrated circuit package 30 is fabricated with an absence of silicone encapsulant material (i.e. silicone encapsulant material 19 of FIG. 1) thereby eliminating the associated difficulties with silicone encapsulants of the prior art. (However, in alternative embodiments, conventional silicon encapsulants are used instead of adhesive to form first and second adhesive layers 38, 42.)

Referring still to FIG. 3, integrated circuit package 30 is fabricated using first and second adhesive layers 38, 42 to decouple TCE mismatch thus avoiding use of a compliant elastomeric layer (i.e. elastomeric layer 15 of FIG. 1) and the associated unreliability, e.g. delamination from moisture. Accordingly, integrated circuit package 30 in accordance with the present invention is fabricated with a higher yield thereby reducing the cost per unit compared to the prior art. Further, integrated circuit package 30 is approximately the size of IC 32, i.e. is a near chip size package.

Figure 4:
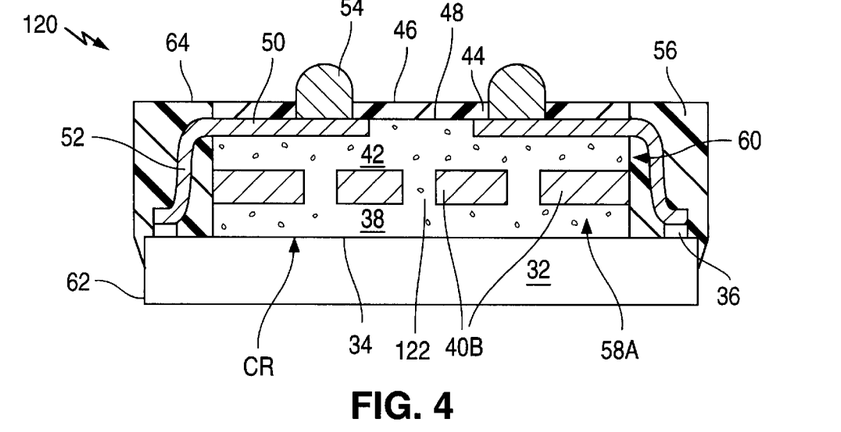
FIGS. 4, 5, 6 and 7 are cross-sectional views of thermally enhanced integrated circuit packages in accordance with alternative embodiments of the present invention.

FIG. 4 is a cross-sectional view of a thermally enhanced integrated circuit package 120 in accordance with an alternative embodiment of the present invention. Integrated circuit package 120 is substantially similar to integrated circuit package 30 of FIG. 3 except that one or more adhesive-filled apertures 122 are formed in heat sink 40B of heat sink structure 58A (FIG. 4) in contrast to the continuous sheet-like heat sink 40 (FIG. 3). Referring to FIG. 4, adhesive-filled apertures 122 extend through heat sink 40B from first adhesive layer 38 to second adhesive layer 42.

Forming heat sink 40B with apertures 122 improves bonding between heat sink 40B and first, second adhesive layers 38, 42 thus inhibiting delamination of heat sink 40B and the associated failure of integrated circuit package 120. Further, forming heat sink 40B with apertures 122 increases the flexibility of heat sink 40B thus reducing stress on IC 32 and substrate 44 produced by heat sink 40B.

Figure 5:
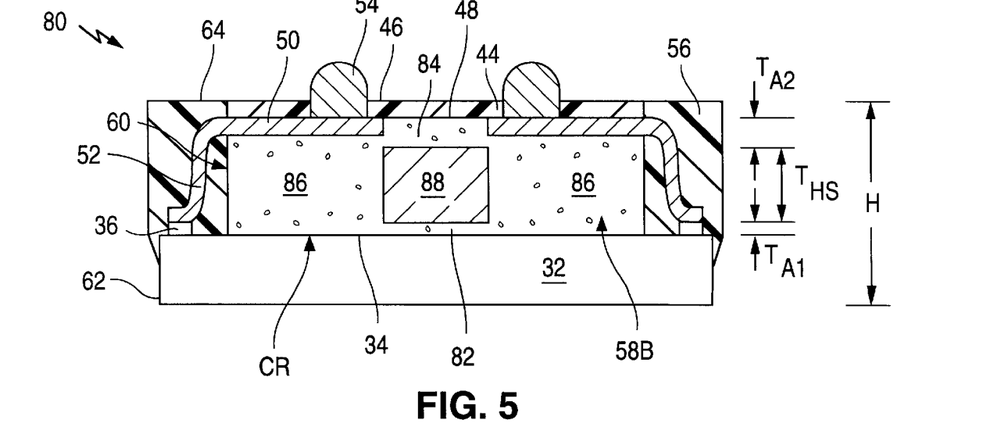

FIG. 5 is a cross-sectional view of a thermally enhanced integrated circuit package 80 in accordance with an alternative embodiment of the present invention. Integrated circuit package 80 is substantially similar to integrated circuit package 30 of FIG. 3 with the exception of heat sink structure 58B (FIG. 5). Referring to FIG. 5, heat sink structure 58B includes first, second and third adhesive layers 82, 84, 86 and heat sink 88. Typically, first, second and third adhesive layers are formed of the same type of adhesive such as that of adhesive layer 38 of FIG. 3. Heat sink 88 overlies only a portion of central region CR of first surface 34 of IC 32. In one embodiment, heat sink 88 overlies 20% or less of the total area of first surface 34 of IC 32 and is located over the center portion of central region CR. Heat sink 88 is formed of a material having a high thermal conductivity e.g. copper.

The sides of heat sink 88 are surrounded by third adhesive layer 86 which extends from first surface 34 of IC 32 to substrate 44. By forming third adhesive layer 86 over most of central region CR, third adhesive layer 86 decouples substantially all of the TCE mismatch between substrate 44 and IC 32. First and second adhesive layers 82, 84, located between heat sink 88 and IC 32, substrate 44, respectively, further decouple TCE mismatch between substrate 44 and IC 32.

Since heat sink 88 has an area in a plane parallel to first surface 34 of IC 32 (hereinafter the area of heat sink 88) less than the area of central region CR, the force exerted on IC 32, substrate 44 during thermal expansion/contraction of heat sink 88 is less than the force exerted by heat sink 40 of FIG. 3. This is because the approximate change in length ΔL of a material caused by a change in temperature ΔT is $$\Delta L = L\alpha \Delta T \tag{1}$$

where L=the length of the material

α=the thermal coefficient of expansion.

As is readily apparent from equation 1, increasing the length L(area) increases the change in length ΔL (change in area) for any given temperature change ΔT. Since heat sink 88 exhibits less overall expansion/contraction compared to heat sink 40 of FIG. 3, first and second adhesive layers 82, 84 decouple less TCE mismatch between heat sink 88 and IC 32, substrate 44, respectively. This allows thicknesses $T_{A1}$, $T_{A2}$ of first, second adhesive layers 82, 84 to be reduced. Accordingly, for a package having the same overall height H, the thickness $T_{HS}$ of heat sink 88 is readily increased compared to the thickness of heat sink 40 of FIG. 3.

For any given temperature differential between IC 32 and substrate 44, an increase in thickness $T_{HS}$ (and a corresponding decrease in thickness $T_{A1}$, $T_{A2}$ of first, second adhesive layers 82, 84) increases the heat transfer per unit area of heat sink 88. Thus, by forming heat sink 88 with a reduced area, the heat transfer per unit area of heat sink 88 is readily promoted.

Figure 6:
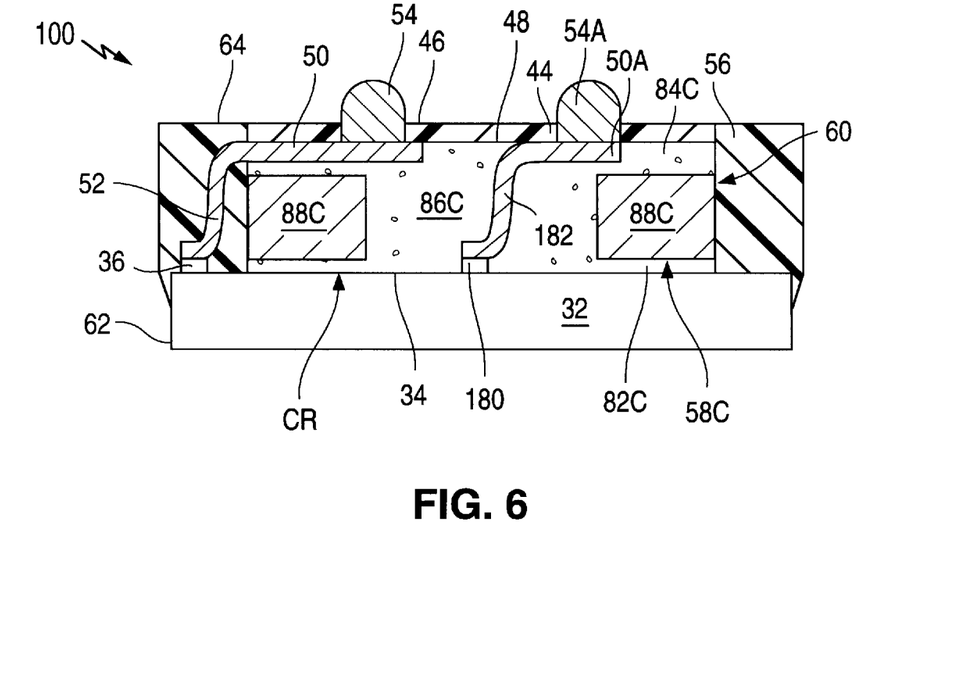

FIG. 6 is a cross-sectional view of a thermally enhanced integrated circuit package 100 in accordance with an alternative embodiment of the present invention. Integrated circuit package 100 is substantially similar to integrated circuit package 80 of FIG. 5 with the exception of heat sink structure 58C (FIG. 6). Referring to FIG. 6, heat sink structure 58C includes a first, second and third adhesive layer 82C, 84C, 86C and a heat sink 88C. In this embodiment, third adhesive layer 86C is located over the central portion of central region CR and heat sink 88C, first, second adhesive layers 82C, 84C are located over the outer most portion of central region CR near its periphery, i.e. adjacent bond pads 36. From a top plan view (not shown), heat sink 88C is rectangular in shape having a central rectangular aperture, i.e. is shaped like a frame. First and second adhesive layers 82C, 84C, separate heat sink 88C from IC 32 and substrate 44, respectively. Third adhesive layer 86C extends from first surface 34 of IC 32 to substrate 44 and fills the aperture in heat sink 88C, i.e. contacts the inner sides of heat sink 88C.

In one embodiment, heat sink 88C overlies 20% or less of the total area of first surface 34 of IC 32. For reasons similar to those discussed above regarding integrated circuit package 80 (FIG. 5), by forming heat sink 88C with a reduced area, heat sink 88C can be made thicker thus enhancing the heat transfer per unit area of heat sink 88C.

By forming heat sink 88C with a central aperture, bond pads 180 in central region CR (hereinafter central bond pads 180) can be readily connected to corresponding interconnect balls 54A. More particularly, central bond pads 180 are electrically connected to corresponding interconnect balls 54A by traces 50A having overhang portions 182 extending through the central aperture of heat sink 88C.

Figure 7:
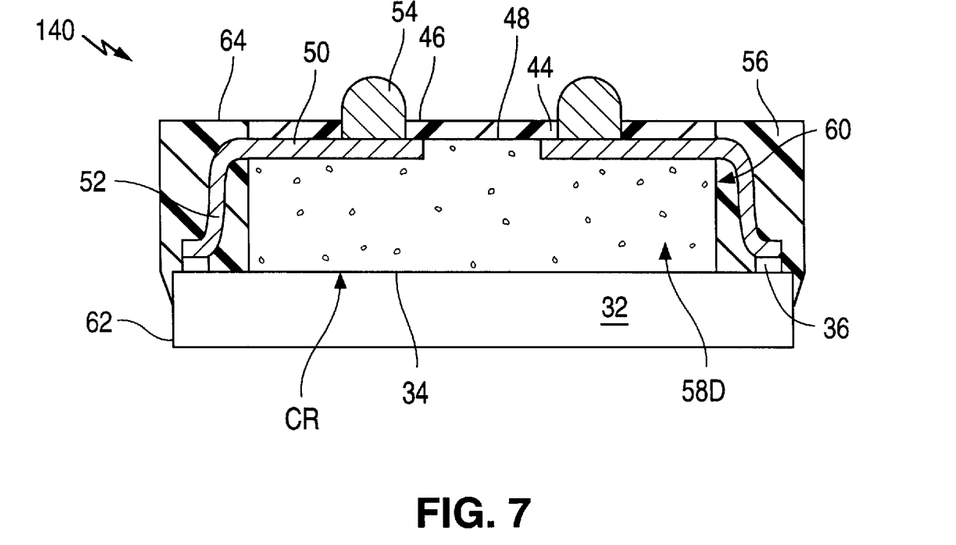

FIG. 7 is a cross-sectional view of a thermally enhanced integrated circuit package 140 in accordance with an alternative embodiment of the present invention. Integrated circuit package 140 is substantially similar to integrated circuit package 30 of FIG. 3 except that heat sink structure 58D (FIG. 7) is made entirely of a low stress adhesive material containing filler material with a high thermal conductivity greater than the thermal conductivity of the low stress adhesive. In this embodiment, heat sink structure 58D is an electrically insulating material since it directly contacts traces 50 on second surface 48 of substrate 44. For example, heat sink structure 58D is made of a mixture of an adhesive and an electrically insulative thermally conductive filler such as diamond, aluminum nitride or other suitable material. Illustratively, heat sink structure 58D is a mixture of "577" silicone adhesive manufactured by Dow Corning, Midland, Mich. and diamond or aluminum nitride powder consisting of particles no greater than 3 mils. in size.

It is desirable to form heat sink structure 58D with a high percentage of filler material to enhance thermal conductivity. However, as the percentage of filler material goes up, the elastic nature of heat sink structure 58D goes down. Thus the percentage of filler material used is generally limited to maintain the elastic nature of heat sink structure 58D, e.g. heat sink structure contains 50% or less, preferably in the range of about 15% to about 40%, of filler material.

Still referring to FIG. 7, in an alternative embodiment (not shown), an electrically insulating solder mask is applied on second surface 48 and traces 50 to insure that traces 50 are electrically isolated from heat sink 58D.

In yet another alternative embodiment, instead of forming traces 50 on second surface 48 of substrate 44 as shown, traces 50 are formed on first surface 46 of substrate 44. In this embodiment, substrate 44 is a continuous sheet-like structure and interconnect balls 54 are formed directly on corresponding traces 50. Since substrate 44 is an electrically insulative material, traces 50 are electrically isolated from heat sink structure 58D. Accordingly, in this embodiment (and the embodiment above in which traces 50 are electrically isolated by a solder mask) heat sink structure 58D can be an electrically conductive material, e.g. can contain an electrically conductive and thermally conductive filler such as copper.

In other embodiments (not shown), integrated circuit packages 30, 120, 80, 100 of FIGS. 3, 4, 5, 6, respectively, are formed with traces 50 on first surface 46 of substrate 44 instead of on second surface 48 of substrate 44. In these embodiments, substrate 44 is a continuous sheet-like structure and interconnect balls 54 are formed directly on corresponding traces 50. Further, a soldermask is typically applied on first surface 46 of substrate 44 and on traces 50.

Figure 8A:
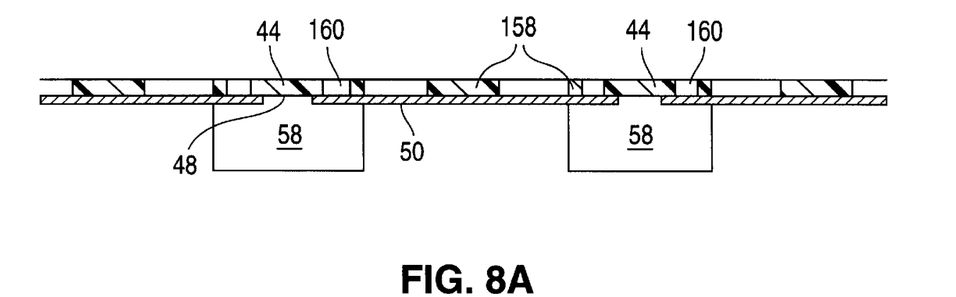
FIGS. 8A, 8B, 8C, 8D, 8E and 8F are cross-sectional views illustrating the fabrication of the thermally enhanced integrated circuit package of FIG. 3 in accordance with the present invention.

FIGS. 8A, 8B, 8C, 8D, 8E and 8F are cross-sectional views illustrating the fabrication of thermally enhanced integrated circuit packages 30 in accordance with the present invention. As shown in FIG. 8A, a conventional strip-like tape 158 is provided which includes a plurality of substrates 44 each having a second surface 48 with traces 50 and a heat sink structure 58 attached thereto. Overlying heat sink structures 58 are a plurality of apertures 160 in substrates 44. Apertures 160 expose portions of traces 50.

Figure 8B:
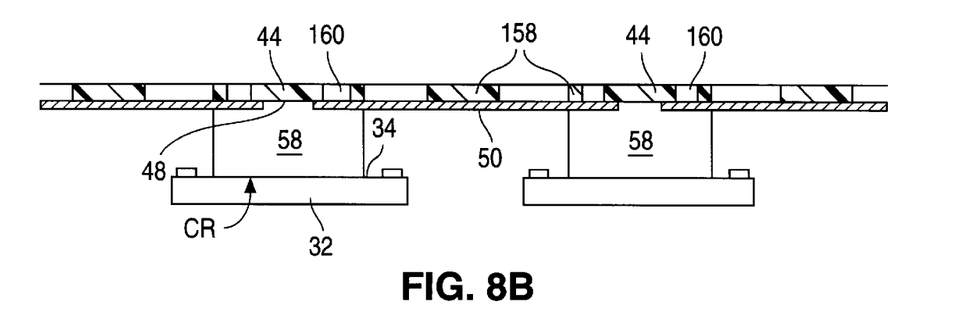
Figure 8C:
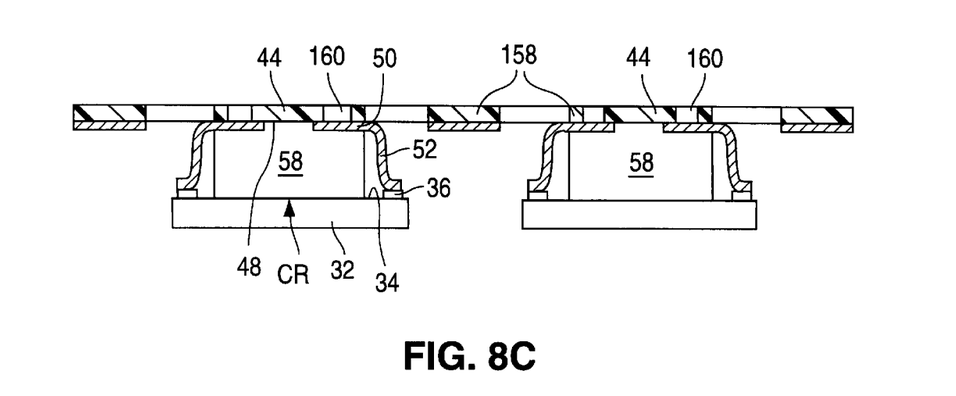

Referring now to FIG. 8B, the central regions CR of first surfaces 34 of ICs 32 are attached to heat sink structures 58 typically by an adhesive layer of heat sink structures 58 (e.g. first adhesive layer 38 of FIG. 3). As shown in FIG. 8C, overhang portions 52 of traces 50 are then bonded to corresponding ones of bond pads 36 using conventional techniques.

Figure 8D:
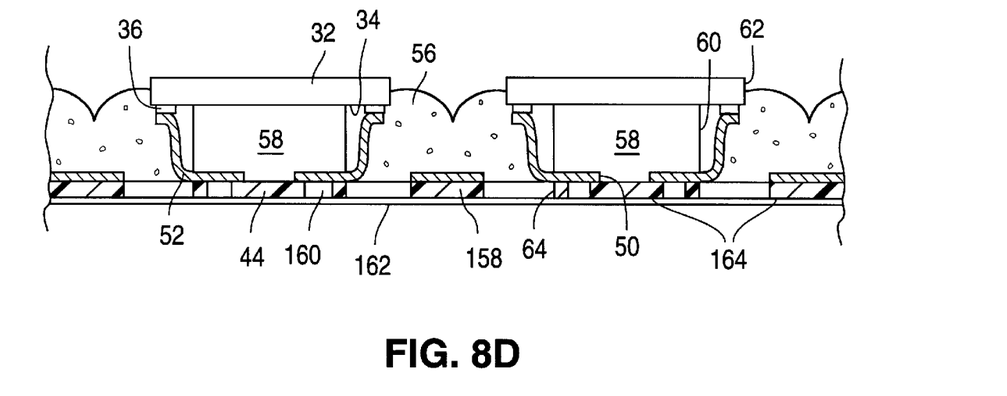

Referring now to FIG. 8D, a conventional coverlay 162 is applied to first surface 164 of tape 158 and the entire structure is inverted so that ICs 32 are above tape 158. Encapsulant 56 is then applied to enclose bond pads 36 including the adjacent portion of first surfaces 34 of ICs 32, overhang portions 52 of traces 50 and the sides 60 of heat sink structures 58. Encapsulant 56 also encloses portions of sides 62 of ICs 32 and sides 64 of substrates 44.

Figure 8E:
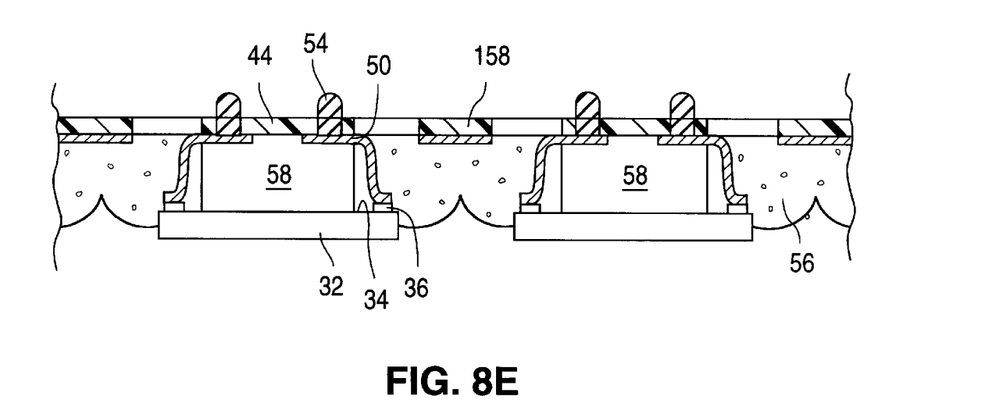
Figure 8F:
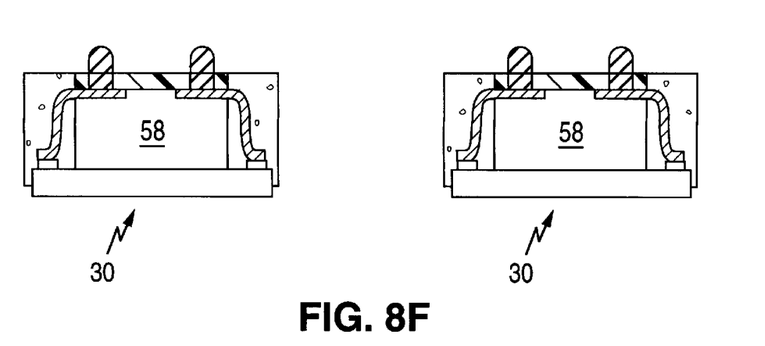

Referring now to FIG. 8E, the entire assembly is again inverted so that tape 158 lies above ICs 32. Coverlay 162 (not shown) is removed and interconnect balls 54 are formed on traces 50 and in apertures 160 using conventional techniques. After interconnect balls 54 are formed, integrated circuit packages 30 are tested and any defective integrated circuit packages 30 are marked for disposal. Tape 158 and encapsulant 56 are then cut to singulate integrated circuit packages 30. Integrated circuit packages 120, 80, 100, and 140 of FIGS. 4, 5, 6, and 7 can also be fabricated using techniques similar to that illustrated in FIGS. 8A, 8B, 8C, 8D, 8E and 8F.

Having thus described the preferred embodiments, persons skilled in the art will recognize that changes may be made in form and detail without departing from the spirit and scope of the invention. For example, referring to FIG. 3, in alternative embodiments, overhang portions 52 are not formed and bondwires are used to electrically connect traces 50 to bond pads 36. Further, although the surface area of substrate 44 is less than the surface area of IC 32 and all interconnect balls 54 are located inward of bond pads 36 (i.e. fan-in of interconnect balls 54), in alternative embodiments the surface area of substrate 44 is greater than the surface area of IC 32 and some or all interconnect balls 54 are formed outward of bond pads 36 (i.e. fan-out of interconnect balls 54). Further, interconnect balls 54 can be replaced with other interconnect structures, i.e. interconnect pads. Thus the invention is limited only by the following claims.

I claim:

1. A thermally enhanced package for a semiconductor device, said semiconductor device having a first surface with bond pads formed thereon, said package comprising:

a heat sink structure formed on a central region of said first surface of said semiconductor device inward of said bond pads; and an electrically insulative substrate having a first surface attached to said heat sink structure, said heat sink structure having a heat sink including an electrically insulative material, a first layer between said heat sink and said first surface of said semiconductor device, and a second layer between said heat sink and said first surface of said substrate.

2. The thermally enhanced package of claim 1 further comprising:

electrically conductive traces attached to said substrate and electrically connected to said bond pads; and interconnect structures formed on portions of said traces.

3. The thermally enhanced package of claim 2 wherein said interconnect structures are selected from the group consisting of interconnect balls and interconnect pads.

4. The thermally enhanced package of claim 2 wherein said traces are attached to a second surface of said substrate opposite said first surface of said substrate.

5. The thermally enhanced package of claim 2 further comprising an electrically insulative encapsulant which encloses said bond pads, portions of said traces, and sides of said heat sink structure.

6. The thermally enhanced package of claim 1 wherein said first layer and said second layer are adhesive.

7. A thermally enhanced package for a semiconductor device, said semiconductor device having a first surface with bond pads formed thereon, said package comprising:

a heat sink structure attached to a central region of said first surface of said semiconductor device inward of said bond pads; and an electrically insulative substrate having a first surface attached to said heat sink structure, wherein said heat sink structure comprises a heat sink, a first layer between said heat sink and said first surface of said semiconductor device and a second layer between said heat sink and said first surface of said substrate, wherein said substrate is a polyimide tape.

8. The thermally enhanced package of claim 1 wherein said heat sink is a continuous sheet material which overlies said central region of said first surface of said semiconductor device.

9. A thermally enhanced package for a semiconductor device, said semiconductor device having a first surface with bond pads formed thereon, said package comprising:

a heat sink structure formed on a central region of said first surface of said semiconductor device inward of said bond pads; and an electrically insulative substrate having a first surface attached to said heat sink structure, wherein said heat sink structure comprises a heat sink, a first layer between said heat sink and said first surface of said semiconductor device and a second layer between said heat sink and said first surface of said substrate, said heat sink being a sheet material having one or more apertures formed therein.

10. The thermally enhanced package of claim 9 wherein said one or more apertures contain adhesive.

11. The thermally enhanced package of claim 1 wherein said heat sink overlies a first portion of said central region of said first surface of said semiconductor device.

12. The thermally enhanced package of claim 11 wherein said first portion is no greater than twenty percent (20%) of said first surface of said semiconductor device.

13. The thermally enhanced package of claim 11 wherein said first portion is the central portion of said central region of said first surface of said semiconductor device.

14. The thermally enhanced package of claim 11 wherein said first portion is the outer most portion of said central region of said first surface of said semiconductor device adjacent said bond pads.

15. A thermally enhanced package for a semiconductor device, said semiconductor device having a first surface with bond pads formed thereon, said package comprising:
   a heat sink structure attached to a central region of said first surface of said semiconductor device inward of said bond pads;
   an electrically insulative substrate having a first surface attached to said heat sink structure, wherein said heat sink structure comprises a heat sink, a first layer between said heat sink and said first surface of said semiconductor device and a second layer between said heat sink and said first surface of said substrate, wherein said heat sink comprises a central aperture and said heat sink overlies a first portion of said central region of said first surface of said semiconductor device, said first portion being an outer most portion of said central region of said first surface of said semiconductor device adjacent said bond pads;
   at least one central bond pad located in said central region of said first surface of said semiconductor device; and
   at least one trace having an overhang portion extending through said central aperture to said at least one central bond pad.

16. The thermally enhanced package of claim 11 wherein said heat sink structure further comprises a third layer overlying an outer most portion of said central region of said first surface of said semiconductor device, said third layer extending from said first surface of said semiconductor device to said first surface of said substrate.

17. The thermally enhanced package of claim 16 wherein said third layer is adhesive.

18. A thermally enhanced package for a semiconductor device, said semiconductor device having a first surface with bond pads formed thereon, said package comprising:
   a heat sink structure attached to a central region of said first surface of said semiconductor device inward of said bond pads; and
   an electrically insulative substrate having a first surface attached to said heat sink structure, wherein said heat sink structure comprises a first component for decoupling thermal stress between said semiconductor device and said substrate and a second component mixed within said first component, said second component having a higher thermal conductivity than said first component.

19. The thermally enhanced package of claim 18 wherein said first component and said second component are electrically insulating materials.

20. The thermally enhanced package of claim 18 wherein said first component is adhesive.

21. A thermally enhanced package for a semiconductor device, said semiconductor device having a first surface with bond pads formed thereon, said package comprising:
   a heat sink structure attached to a central region of said first surface of said semiconductor device inward of said bond pads; and
   an electrically insulative substrate having a first surface attached to said heat sink structure, wherein said heat sink structure is a mixture comprising a first component for decoupling thermal stress between said semiconductor device and said substrate and a second component having a higher thermal conductivity than said first component, wherein said second component is selected from the group consisting of diamond, aluminum nitride and silver powder.

22. A thermally enhanced package for a semiconductor device, said semiconductor device having a first surface with bond pads formed thereon, said package comprising:
   a heat sink structure attached to a central region of said first surface of said semiconductor device inward of said bond pads; and
   an electrically insulative substrate having a first surface attached to said heat sink structure, wherein said heat sink structure is a mixture comprising a first component for decoupling thermal stress between said semiconductor device and said substrate and a second component having a higher thermal conductivity than said first component, wherein the percentage of said second component in said mixture is fifty percent (50%) or less.

23. A thermally enhanced package for a semiconductor device, said semiconductor device having bond pads formed thereon, comprising:
   a heat sink supported by said semiconductor device;
   an electrically insulative substrate supported by said semiconductor device;
   a first layer disposed between said heat sink and said semiconductor device;
   a second layer disposed between said heat sink and said substrate;
   electrically conductive traces electrically communicating to said bond pads; and
   interconnect structures electrically communicating with said traces;
      wherein at least one of said bond pads is a central bond pad located on a central region of a first surface of said semiconductor device such that one of said traces electrically communicates to said central bond pad through said at least one aperture.

24. A thermally enhanced package for a semiconductor device, said semiconductor device having bond pads formed thereon, comprising:
   a heat sink supported by said semiconductor device;
   an electrically insulative substrate supported by said semiconductor device;
   a first layer disposed between said heat sink and said semiconductor device; and
   a second layer disposed between said heat sink and said substrate;
      said first layer decoupling any thermal stress between said semiconductor device and said heat sink and said second layer decoupling any thermal stress between said substrate and said heat sink.

25. A thermally enhanced package for a semiconductor device, said semiconductor device having bond pads formed thereon, comprising:

a heat sink supported by said semiconductor device;

an electrically insulative substrate supported by said semiconductor device;

a first layer disposed between said heat sink and said semiconductor device; and a second layer disposed between said heat sink and said substrate;

said substrate being a polyimide tape.

26. The thermally enhanced package of claim 24, wherein said at least one aperture contains an adhesive.

27. The thermally enhanced package of claim 24, wherein said heat sink overlies up to about twenty percent (20%) of a first surface of said semiconductor device.

28. A thermally enhanced package for a semiconductor device, said semiconductor device having bond pads formed thereon, comprising:

a heat sink supported by said semiconductor device;

an electrically insulative substrate supported by said semiconductor device;

a first layer disposed between said heat sink and said semiconductor device;

a second layer disposed between said heat sink and said substrate; and a third layer extending from said substrate to said semiconductor device;

wherein said first layer decouples any thermal stress between said semiconductor device and said heat sink, said second layer decouples any thermal stress between said substrate and said heat sink, and said third layer decouples any thermal stress between said semiconductor device and said substrate.

29. The thermally enhanced package of claim 28, wherein said substrate is a polyimide tape.

30. The thermally enhanced package of claim 28, wherein said heat sink overlies up to about twenty percent (20%) of a first surface of said semiconductor device.

31. The thermally enhanced package of claim 24, additionally comprising:

electrically conductive traces electrically communicating to said bond pads; and interconnect structures electrically communicating with said traces.

32. The thermally enhanced package of claim 24, additionally comprising an electrically insulative encapsulant, said encapsulant covers said bond pads and encloses said heat sink, said first layer, and second layer.

33. The thermally enhanced package of claim 24, wherein said first and second layers are adhesives.

34. The thermally enhanced package of claim 28, additionally comprising:

electrically conductive traces electrically communicating to said bond pads; and interconnect structures electrically communicating with said traces.

35. The thermally enhanced package of claim 28, further comprising an electrically insulative encapsulate, said encapsulant covering said bond pads and enclosing said heat sink, said first layer, and said second layer.

36. The thermally enhanced package of claim 28, wherein said first, second, and third layers comprise an adhesive.

* * * * *